United States Patent [19]
Keum

[11] Patent Number: 5,728,491
[45] Date of Patent: Mar. 17, 1998

[54] PHASE SHIFT MASK AND METHOD OF MANUFACTURE

[75] Inventor: Eun Seop Keum, Suwon, Rep. of Korea

[73] Assignee: Goldstar Electron Co., Ltd., Cheongju, Rep. of Korea

[21] Appl. No.: 338,982

[22] Filed: Nov. 14, 1994

Related U.S. Application Data

[63] Continuation of Ser. No. 208,062, Mar. 8, 1994, abandoned, which is a continuation of Ser. No. 882,213, May 13, 1992, abandoned.

[30] Foreign Application Priority Data

May 13, 1991 [KR] Rep. of Korea .................. 7710/1991

[51] Int. Cl.⁶ .................................................. G03F 9/00
[52] U.S. Cl. ............................................................ 430/5
[58] Field of Search ................................................. 430/5

[56] References Cited

U.S. PATENT DOCUMENTS

| | | | |
|---|---|---|---|
| 5,045,417 | 9/1991 | Okamoto | 430/5 |
| 5,208,125 | 5/1993 | Lowrey et al. | 430/5 |

FOREIGN PATENT DOCUMENTS 4006557  1/1992  Japan.

OTHER PUBLICATIONS

\*\* Handbook of VLSI Microlithography . . . Edited by William B. Glendinning (Nobleboro, Maine) and John N. Helbert (Advanced Technology Center) Motorola, Inc., Mesa, Arizona pp. 352,353,354,355,356,357,364.

IEDM 90–821, Transparent Phase Shifting Mask — by H. Watanabe, Y. Todokoro,and M. Inoue, Kyoto Research Laboratory, Matsushita Electronics Corporation 19, Nishikujo-Kasugacho, Minami-ku, Kyoto 601 Japan, pp. 33.2.1, 33.2.2, 33.2.3, 33.2.4.

*Primary Examiner*—Mark Chapman
*Attorney, Agent, or Firm*—Alan R. Loudermilk

[57] ABSTRACT

A phase shift mask and method of manufacture are disclosed in which a light shielding layer is formed on a substrate and patterned to produce parallel areas of predetermined intervals and spacings of the desired shape. A phase shift film is formed on the substrate and light shielding layer. The phase shift film is patterned so that remaining portions of the phase shift film fully shield the parallel areas of the light shielding layer.

20 Claims, 7 Drawing Sheets

FIG. 3A
(PRIOR ART)
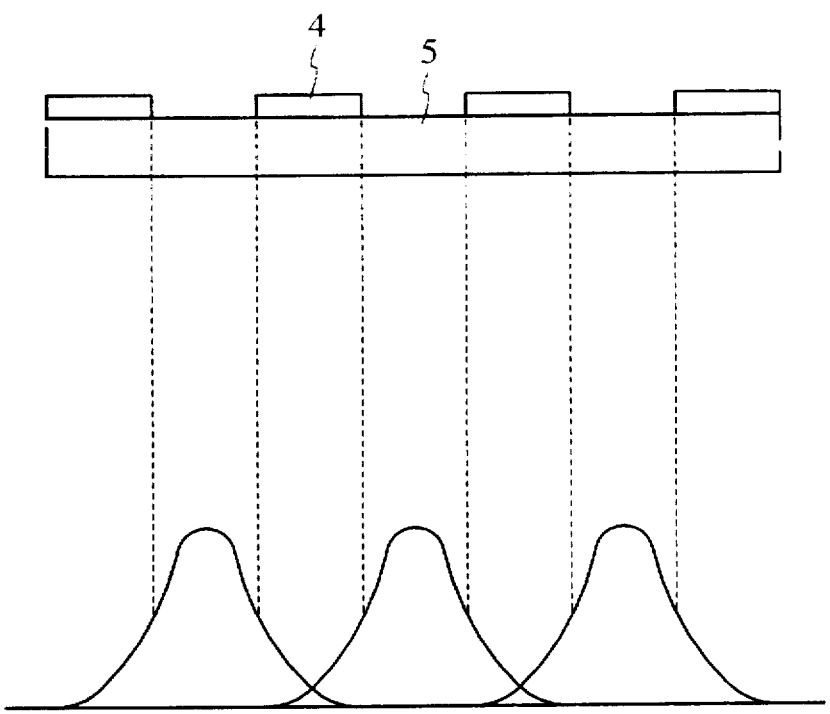
FIG. 3B
(PRIOR ART)
FIG. 3C
(PRIOR ART)
FIG. 3D
(PRIOR ART)

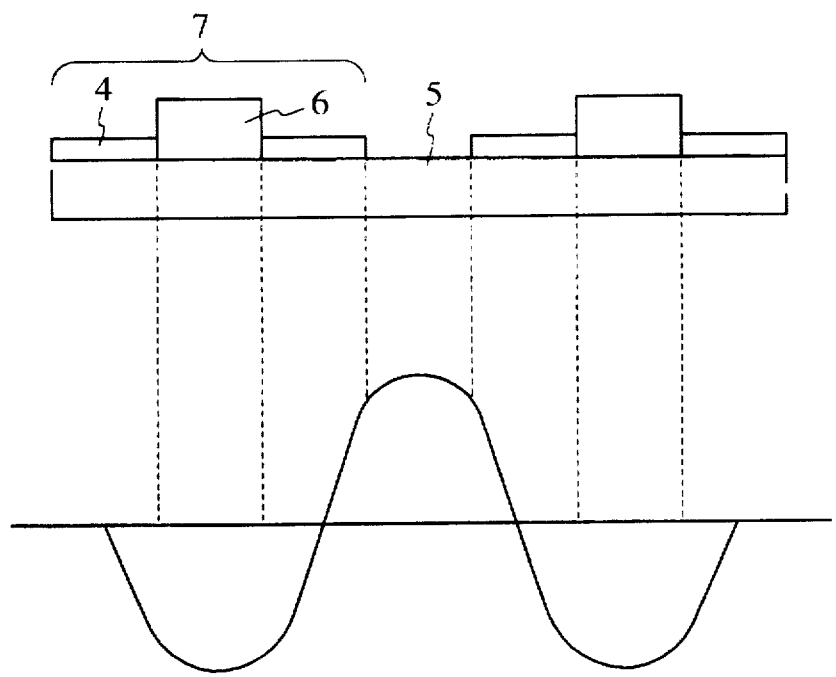
FIG. 4A
(PRIOR ART)
FIG. 4B
(PRIOR ART)
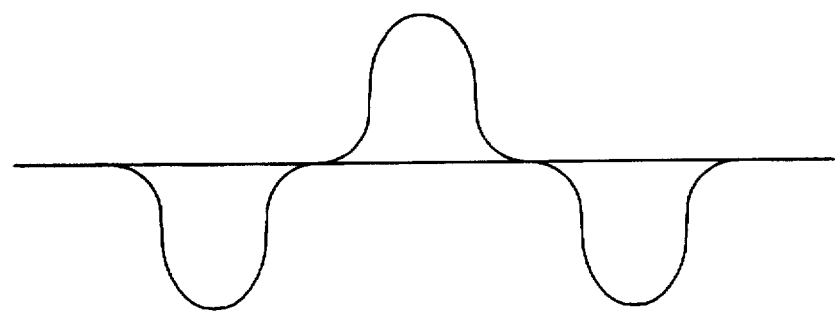
FIG. 4C
(PRIOR ART)
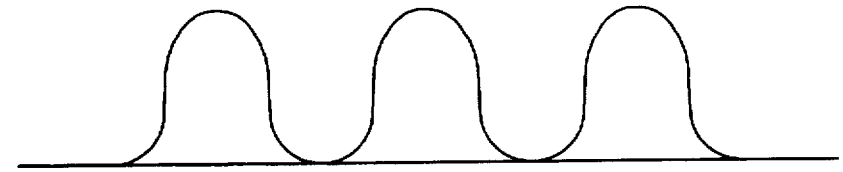
FIG. 4D
(PRIOR ART)

FIG. 7A
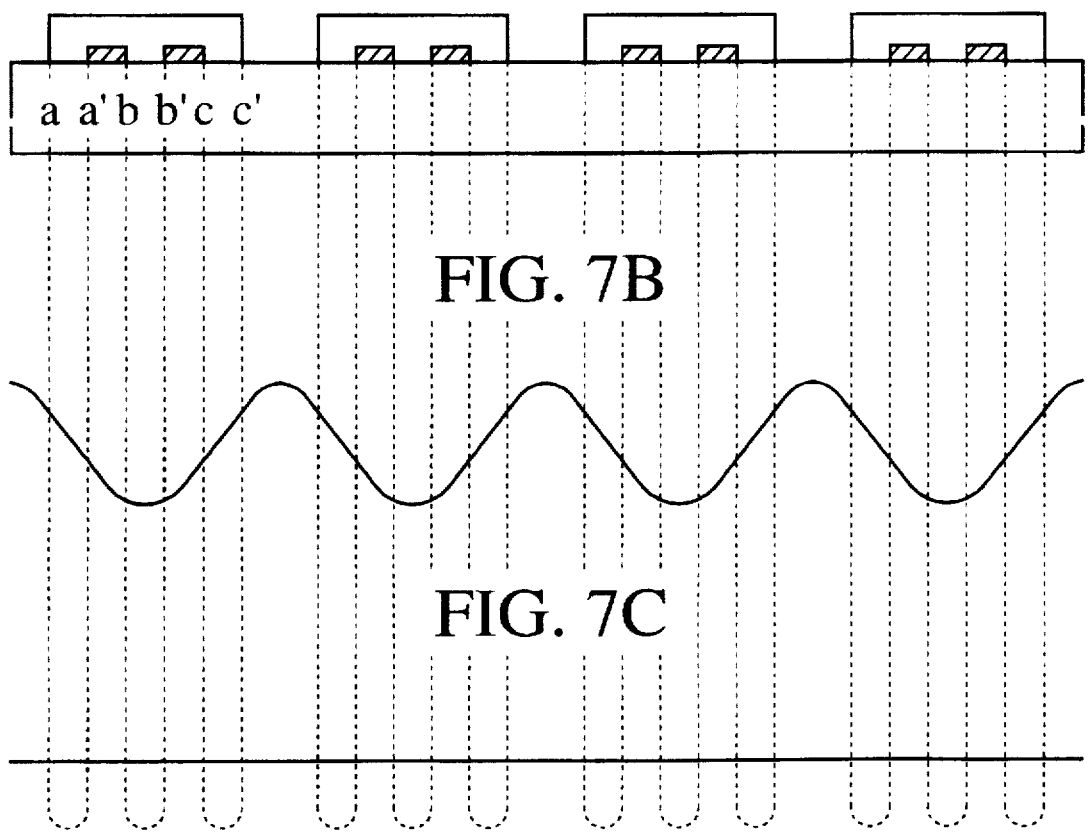
FIG. 7B
FIG. 7C
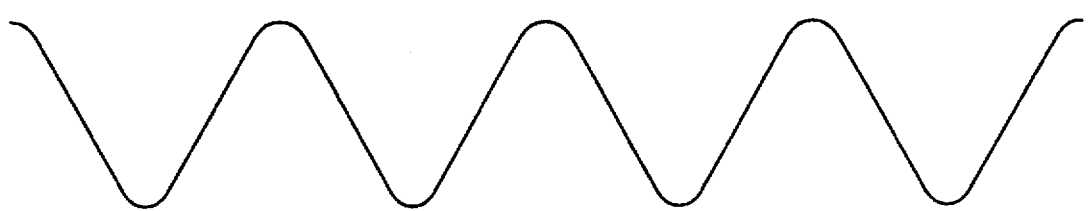
FIG. 7D

PHASE SHIFT MASK AND METHOD OF MANUFACTURE

This is a continuation of application Ser. No. 08/208,062 filed on Mar. 8, 1994, now abandoned, which is a continuation of application Ser. No. 07/882,213 filed on May 13, 1992, now abandoned.

BACKGROUND OF THE INVENTION

1. Field of the Invention

The present invention relates to phase shift masks, and more particularly to phase shift masks with both edge stress type and light shielded stress type phase shift mask effects and also to a method of manufacture of such phase shift masks.

2. Description of the Prior Art

A mask for hyperfine patterning of submicron units recently has been needed in order to achieve the integration of all desired elements. In order to meet this requirement, phase shift masks have been developed. The manufacturing theory of the phase shift mask is as follows.

As illustrated in FIG. 1, phase shift film 1 is utilized in the manufacture of a phase shift mask. The role of phase shift film 1 is to shift the phase of the incident light by approximately 180 degrees. In FIG. 1, code 2 indicates chrome ("Cr") and code 3 indicates silica. The downward pointing arrows represent incident light.

FIG. 2 illustrates various light amplitudes, with graph (a) indicating the light amplitude incident on silica 3 when phase shift film 1 is not present, and graph (b) indicating the light amplitude when phase shift film 1 is present. As illustrated in FIG. 2, the phase of the light amplitude is shifted by 180° by phase shift film 1. Here, if n represents the refractive index of phase shift film 1, d represents thickness of phase shift film 1, no represents the refractive index of air, and λ represents the wavelength of the incident light, the phase difference 6 of graph (a) and (b) of FIG. 2 can be put into the following formula (1):

$$\delta = k \cdot n \cdot d - k \cdot n_o \cdot d \quad (1)$$
$$= k \cdot (n - n_o)d$$
$$= \frac{2\pi}{\lambda}(n-1)d$$

In accordance with formula (1), phase difference δ should be 180° in order for the phase to be ideally shifted. If π is substituted into formula (1) instead of the phase difference δ, the thickness of phase shift film 1 to be appropriately shifted can be put into the following formula (2):

$$d = \frac{\lambda}{2(n-1)} \quad (2)$$

With reference to FIG. 3 and FIG. 4, a comparison of the general mask with the phase shift mask is as follows.

FIG. 3(a) illustrates general mask 4 for patterning a wafer or the like, which as shown has elements that are aligned in parallel on substrate 5. FIG. 3(b) illustrates the light amplitude out of mask 4. FIG. 3(c) illustrates the light amplitude out of substrate 5. FIG. 3(d) illustrates the resulting light intensity out of substrate 5.

As shown in FIG. 3(b), the light amplitude out of adjacent openings of mask 4 constructively interfere with each other, and the intensity differences out of substrate 5 are not well defined because the difference in light amplitude and intensity are slight, as shown in FIG. 3(c) and FIG. 3(d).

Accordingly, as hyperfine patterning is attempted, the degree of offset must be larger, and as a result hyperfine patterning cannot be performed in a precise manner with such a general mask as general mask 4.

FIG. 4(a) illustrates the alignment state of phase shift mask 7 having phase shift film 6 between mask patterns 4. FIG. 4(b) illustrates the light amplitude out of the areas between mask patterns 4. FIG. 4(c) illustrates the light amplitude out of substrate 5. FIG. 4(d) illustrates the light intensity out of substrate 5. As illustrated in FIG. 4(c) and FIG. 4(d), the difference in light amplitude is greater, so that the difference in intensity is more defined, and therefore hyperfine patterning may be better achieved.

There are known to be spatial frequency modulation type, edge stress type and cut-off effect stress type phase shift masks, and these types of phase shift masks will be explained with reference to FIG. 5(a)–FIG. 5(f).

FIG. 5(a) illustrates the spatial frequency modulation type of phase shift mask. Patterning is performed through openings in chrome film 9, which is formed on silica substrate 8. Phase shift film 10 is formed between patterned portions of chrome film 9 as shown in FIG. 5(a).

FIG. 5(b) and FIG. 5(c) illustrate the edge stress type of phase shift mask. Phase shift film 10 is formed so as to shield patterned chrome film 9 (which is formed on silica substrate 8) as shown in FIG. 5(b), or alternatively phase shift film 10 is formed on top of chrome film 9 (which is formed on silica substrate 8) as shown in FIG. 5(c).

FIG. 5(d)–FIG. 5(f) illustrate the cut-off effect stress type of phase shift mask. Referring to FIG. 5(d), phase shift film 10 is formed between portions of patterned chrome film 9. Alternatively, phase shift film 10 is formed on separated portions of chrome film 9, with chrome film 9 having been patterned and separated as shown in FIG. 5(e). Still alternatively, chrome film 9 is formed on portions of silica substrate 8, which has been patterned and repeatedly etched to the predetermined width to provide appropriate phase shifting as shown in FIG. 5(f).

As shown in FIG. 5, the manufacturing processes for the phase shift masks of FIG. 5(b) and FIG. 5(e) generally come under the categories of edge stress type and cut-off effect stress type and will be explained in turn. The manufacturing process for the edge stress type phase shift mask as shown in FIG. 5(b) now will be explained.

First, chrome film 9 generally is formed on silica substrate 8. Thereafter, photoresist (not shown) is coated on chrome film 9, and then an ordinary masking process (photo and etch process) is performed, forming patterned chrome film 9 having parallel portions of a predetermined interval. Thereafter, the photoresist used for patterning of chrome film 9 is removed, and then phase shift film 10 is formed over the whole surface. Thereafter, photoresist (not shown) is coated on phase shift film 10, which is followed by an ordinary masking process, forming the desired patterning of phase shift film 10. As a result of these steps, phase shift film 10 is patterned so that each pattern of chrome film 9 is fully shielded as shown in FIG. 5(b).

The manufacturing process for the cut-off effect stress type phase shift mask of FIG. 5(e) now will be explained.

First, chrome film 9 is wholly formed on silica substrate 8, and photoresist (not shown) is coated on chrome film 9. Thereafter, an ordinary masking process is performed, and chrome film 9 is patterned to form parallel portions of a predetermined interval. Thereafter, photoresist (not shown) again is coated on the patterned chrome film 9, and again a masking process is performed, and chrome film 9 is patterned so as to remove central regions of the portions of chrome film 9 as shown in FIG. 5(e).

At this time chrome film 9 has remaining edge parts of the portions of chrome film 9 produced after the first masking step, the central regions thereof having been removed to the degree of a predetermined width by the second masking step. Thereafter, the remaining photoresist is removed, and then phase shift film 10 of a predetermined thickness is formed over the whole surface. Thereafter, photoresist (not shown) is coated on phase shift film 10, and an ordinary masking process is performed, and phase shift film 10 is patterned so that portions of phase shift film 10 are removed except for regions between portions of the individual elements of the pairs of patterned chrome film 9 as shown in FIG. 5(e). As shown in FIG. 5(e), phase shift film 10 does not extend over the entirety of the portions of chrome film 9.

However, there is a problem according to the above conventional art. First, with edge stress type phase shift masks, since the phase shift film was formed only on the edge parts over both sides of the patterned chrome film, the light phase shift effect was inadequate in the case of hyperfine patterning. Also, in a mask for submicron detail, as the interval of the chrome pattern film became very narrow, it was difficult to isolate and form the phase shift film.

Second, the manufacturing process of the light shielded effect stress type phase shift mask of FIG. 5(e) was difficult due to the required hyperfine patterning of the chrome film for submicron detail. Also, in patterning a wafer using this type of phase shift mask, the correct patterning profile could not be obtained using a negative type sensitizer.

SUMMARY OF THE INVENTION

In order to overcome the above problems, it is an object of the present invention to provide a manufacturing process for a phase shift mask with improved image patterning and depth of effective focus by removing the difficulties of conventional edge stress type phase shift masks and light shielded effect stress type phase shift masks.

First, the chrome film is formed in the shape of two pieces of a first predetermined interval or spacing on the silica substrate in the form of a pair, with each pair a second predetermined interval or spacing from other such pairs, and then the phase shift film is formed on the whole surface in the specified thickness. An ordinary masking process is performed so that the remaining phase shift film is able to fully shield the chrome film of each pair. With patterning according to the above process, the depth of focus and the image force are not only improved, but the manufacturing process also is simplified.

BRIEF DESCRIPTION OF THE DRAWING

FIG. 3(a) is a cross-sectional view of a general mask;

FIG. 3(b) is a light amplitude diagram from a general mask of the structure of FIG. 3(a);

FIG. 3(c) is a light amplitude diagram of the structure of FIG. 3(a);

FIG. 3(d) is a light intensity diagram of the structure of FIG. 3(a);

FIG. 4(a) is a cross-sectional view of a general phase shift mask;

FIG. 4(b) is a light amplitude diagram from a mask of the structure of FIG. 4(a);

FIG. 4(c) is a light amplitude diagram of the structure of FIG. 4(a);

FIG. 4(d) is a light intensity diagram of the structure of FIG. 4(a);

FIG. 7(a) is a cross-sectional view of a phase shift mask according to the present invention;

FIG. 7(b) is a light amplitude phase diagram of a general mask;

FIG. 7(c) is a light phase shift diagram of the structure of FIG. 7(a); and

FIG. 7(d) is a phase amplitude diagram reflecting the effect on the light amplitude phase illustrated in FIG. 7(b) of the phase shift illustrated in FIG. 7(c).

The codes for the principal parts of the drawings explaining the present invention are as follows:

11: silica substrate;
12: chrome film;
13: phase shift film; and
14: photoresist.

DETAILED DESCRIPTION OF THE PREFERRED EMBODIMENT

With reference to FIG. 6 and FIG. 7, the present invention now will be explained.

FIG. 6(a)–FIG. 6(d) illustrate cross-sectional views of manufacturing processes for the present invention.

Figure 1:
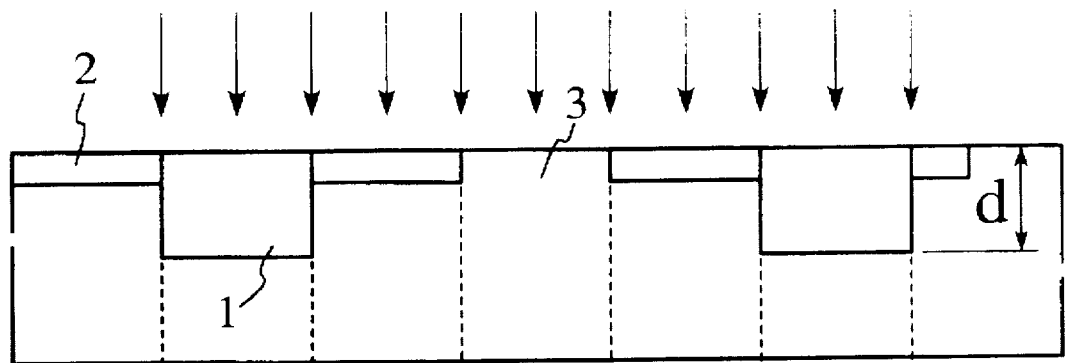
FIG. 1 and FIG. 2 are explanatory diagrams illustrating principles of phase shift masks.
Figure 2:
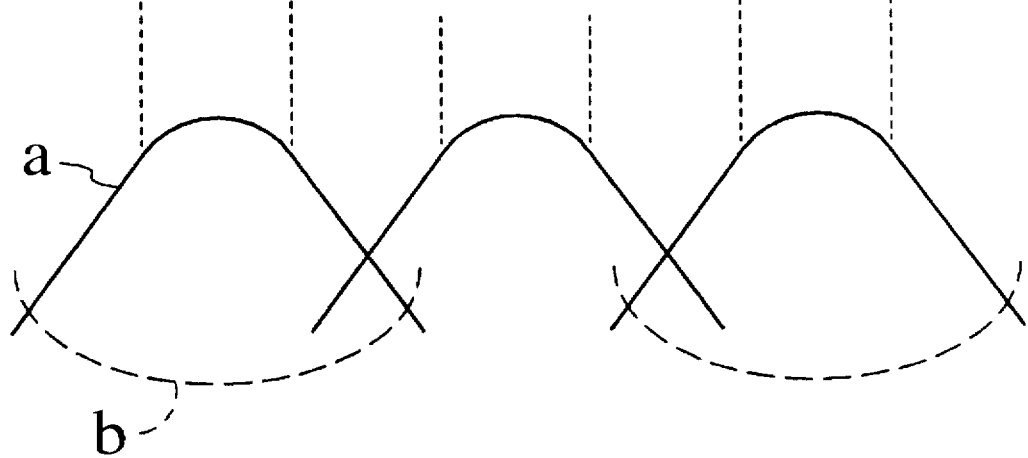
Figure 5A:
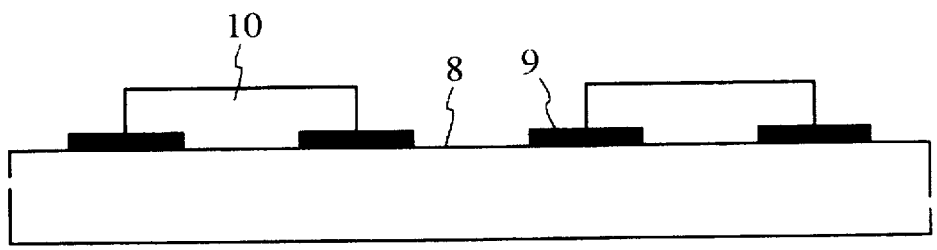
FIG. 5(a)–FIG. 5(f) are cross-sectional views of various types of conventional phase shift masks.
Figure 5B:
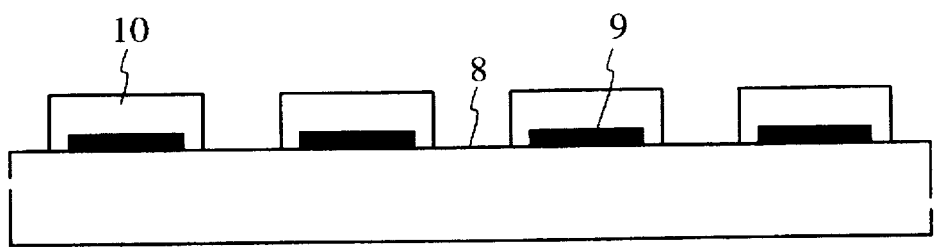
Figure 5C:
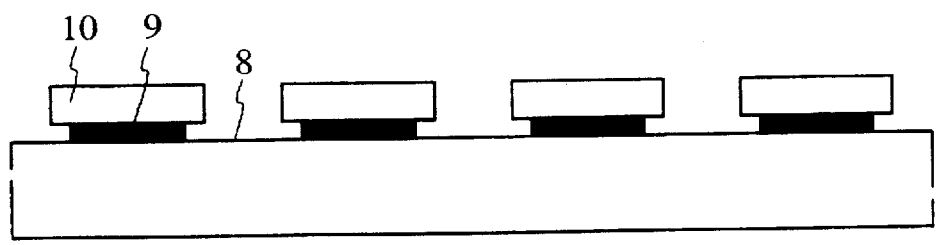
Figure 5D:
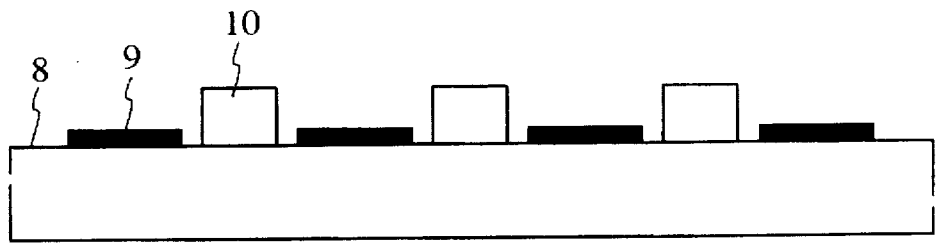
Figure 5E:
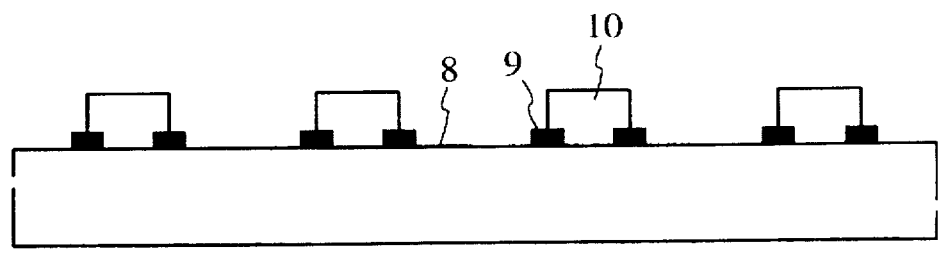
Figure 5F:
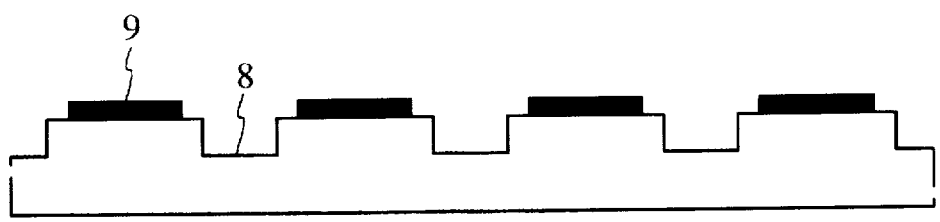
Figure 6A:
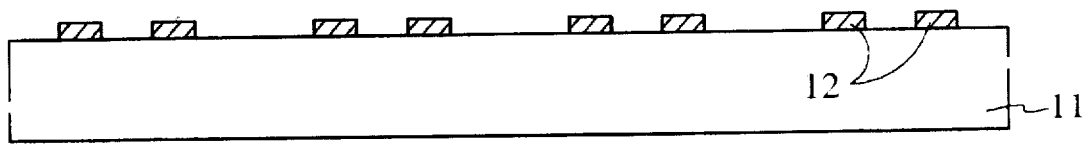
FIG. 6(a)–FIG. 6(d) are cross-sectional views of a manufacturing process of a phase shift mask according to the present invention.

First, chrome film 12 is formed over silica substrate 11 and photoresist (not shown) is coated on chrome film 12. Thereafter, a masking process is performed on the photoresist, and chrome film 12 is patterned to form plural chrome portions as illustrated in FIG. 6(a).

Figure 6B:
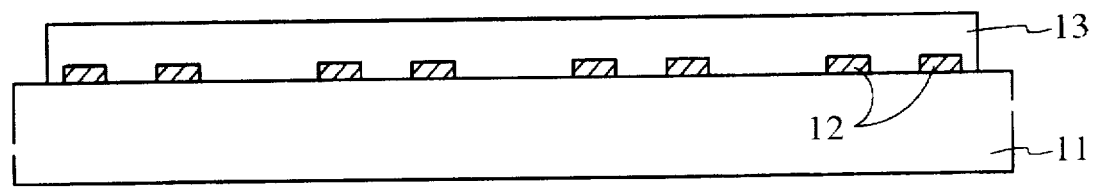

As a result, film 12 is patterned in the shape of pairs having two pieces, with each pair having a first predetermined interval or spacing between the two pieces, and with each pair separated from adjacent pairs by a second predetermined interval or spacing. In order to easily perform the other masking processes to be carried out, the second interval, or the gap between pairs, is set wider than the first interval, or the gap between the portions constituting each pair. Thereafter, phase shift film 13 is formed on the whole surface of opened silica substrate 11 and chrome film 12 as shown in FIG. 6(b).

Thereafter, photoresist 14 is coated over phase shift film 13, and then an ordinary masking process (photo/etch process) is performed. As a result, portions of photoresist 14 and phase shift film 13 between each pair of chrome film 12 are removed as shown in FIG. 6(c).

Figure 6C:
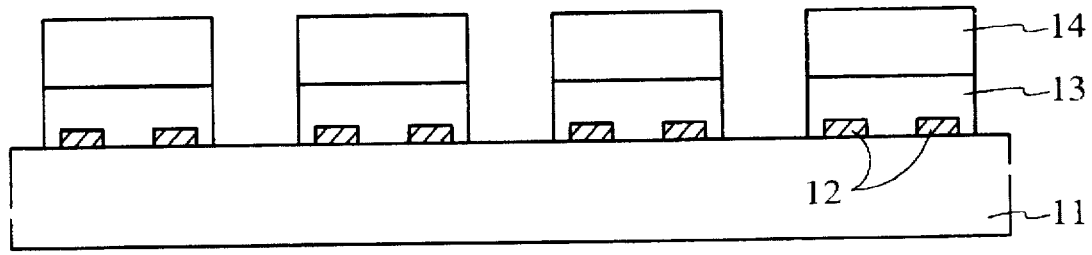

The above steps are performed in the preferred embodiment so that the remaining portions of phase shift film 13 are wider than the width of a pair of portions of chrome film 12 so as to fully shield the two elements of the pair of portions of chrome film 12 as shown in FIG. 6(c). Thereafter, photoresist 14 is removed and the manufacturing process of the phase shift mask is completed as shown in FIG. 6(d).

With reference to FIG. 7(a)–FIG. 7(d), the effect of the phase shift mask of the present invention will be explained as follows.

Figure 6D:
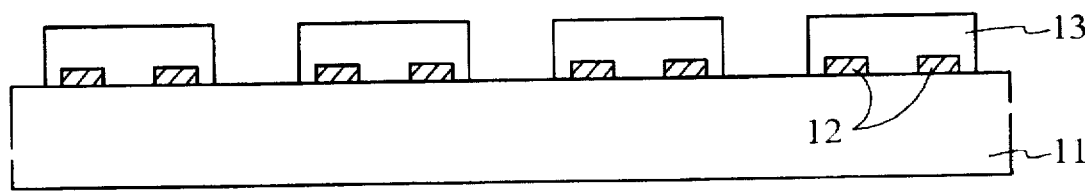

FIG. 7(a) illustrates the phase shift mask having been manufactured by the present invention as shown in FIG. 6(d).

FIG. 7(b) illustrates the light amplitude phase out of the mask if chrome film 12 constituted single portions, instead of the pairs of portions shielded by phase shift film 13 as shown in FIG. 7(a). Here, as this reflects essentially a general mask discussed earlier, it is known that the light amplitude is zero under the portions with chrome film, and the light amplitude has the distribution of the positive probability in the portion without the chrome pattern film.

As illustrated in FIG. 7(c), the light amplitude phase is shifted in regions (a–$a_1$), (b–$b_1$) and (c–$c_1$) by phase shift film 13 of FIG. 7(a).

The light amplitude illustrated in FIG. 7(d) is comparatively larger than the light amplitude phase illustrated in FIG. 7(b) as a result at least in part of the phase shift effect illustrated in FIG. 7(c).

According to the above, the difference of light amplitude can be greater using a phase shift mask according to the present invention, so that hyperfine patterning of a wafer can be performed more correctly.

While the invention is described in connection with preferred embodiments, it will be understood that it is not intended to limit the invention to these embodiments. On the contrary, it is intended to cover all alternatives, modifications and equivalents as may be included in the spirit and scope of this invention as defined by the appended claims.

What is claimed is:

1. A phase shift mask, comprising:

a substrate;

a patterned light shielding layer formed on the substrate, wherein the patterned light shielding layer comprises a pair of substantially parallel elements, wherein the pair of substantially parallel elements has a first gap of a first spacing between the two elements thereof;

a patterned phase shift film formed on the substrate and patterned light shielding layer, wherein portions of the patterned phase shift film extend over the first gap and also extend over each of the two elements of the pair of substantially parallel elements.

2. The phase shift mask of claim 1, wherein the patterned light shielding layer comprises at least a first pair and second pair of substantially parallel elements, wherein each of the first and second pairs of substantially parallel elements have a first gap of a first spacing between the two elements of each of the first and second pairs, and wherein portions of the patterned phase shift film extend over the first gap and also over each of the two elements of each of the first and second pairs of substantially parallel elements.

3. The phase shift mask of claim 1, wherein the first and second pairs of substantially parallel elements define a second gap of a second spacing between the first and second pairs, wherein the width of the second spacing is greater than the width of the first spacing.

4. The phase shift mask of claim 1, wherein portions of the patterned phase shift film extend beyond the edges of each of the two elements of the one pair of substantially parallel elements.

5. The phase shift mask of claim 1, wherein portions of the patterned phase shift film are of a first width, wherein the first width is greater than the total width of the two elements of the one pair of substantially parallel elements and the first gap.

6. The phase shift mask of claim 1, wherein the light shielding layer comprises chrome.

7. The phase shift mask of claim 1, wherein the substrate comprises silica.

8. The phase shift mask of claim 1, wherein the phase shift film is of a predetermined thickness, wherein the predetermined thickness of the phase shift film is selected so that incident light of a predetermined wavelength is phase shifted by approximately 180 degrees upon passing through the phase shift film.

9. The phase shift mask of claim 1, wherein the phase shift mask produces an edge stress phase shift effect and also a light shielded stress phase shift effect.

10. A method of manufacturing a phase shift mask, comprising the steps of:

forming a light shielding layer on a substrate;

patterning the light shielding layer to form a pair of substantially parallel elements, wherein the pair of substantially parallel elements has a first gap of a first spacing between the two elements thereof;

forming a phase shift film on the substrate and patterned light shielding layer; and patterning the phase shift film, wherein portions of the phase shift film are removed, wherein the remaining portions of the phase shift film extend over the first gap and also extend over each of the two elements of the pair of substantially parallel elements.

forming a light shielding layer on a substrate;

patterning the light shielding layer to form at least one pair of substantially parallel elements, wherein the one pair of substantially parallel elements has a first gap of a first spacing between the two elements thereof;

forming a phase shift film on the substrate and patterned light shielding layer; and patterning the phase shift film, wherein portions of the phase shift film are removed, wherein the remaining portions of the phase shift film extend over the first gap and also extend over each of the two elements of the one pair of substantially parallel elements.

11. The method of claim 10, wherein the step of patterning the light shielding layer produces at least a first pair and second pair of substantially parallel elements, wherein each of the first and second pairs of substantially parallel elements have a first gap of a first spacing between the two elements of each of the first and second pairs, and wherein the step of patterning the phase shift film produces remaining portions of the phase shift film that extend over the first gap and also over each of the two elements of each of the first and second pairs of substantially parallel elements.

12. The method of claim 10, wherein the first and second pairs of substantially parallel elements define a second gap of a second spacing between the first and second pairs, wherein the width of the second spacing is greater than the width of the first spacing.

13. The method of claim 10, wherein the remaining portions of the phase shift film also extend beyond the edges of each of the two elements of the one pair of substantially parallel elements.

14. The method of claim 10, wherein the remaining portions of the phase shift film are of a first width, wherein the width of the remaining portions of the phase shift film is greater than the total width of the two elements of the one pair of substantially parallel elements and the first gap.

15. The method of claim 10, wherein the light shielding layer comprises chrome.

16. The method of claim 10, wherein the substrate comprises silica.

17. The method of claim 10, wherein the phase shift film is of a predetermined thickness, wherein the predetermined thickness is selected so that incident light of a predetermined wavelength is phase shifted by approximately 180 degrees upon passing through the phase shift film.

18. The method of claim 10, wherein the phase shift mask produces an edge stress phase shift effect and also a light shielded stress phase shift effect.

19. The method of claim 10, wherein the steps of patterning the light shielding layer and patterning the phase shift film are performed using mask and etch processes.

20. The method of claim 10, wherein the steps of patterning the light shielding layer and patterning the phase shift film each comprise the steps of:
  applying a layer of resist;
  patterning the layer of resist; and
  etching the layer of resist and the light shielding layer or phase shift film.

* * * * *

UNITED STATES PATENT AND TRADEMARK OFFICE
CERTIFICATE OF CORRECTION

PATENT NO. : 5,728,491
DATED : March 17, 1998
INVENTOR(S) : Eun Seop Keum

It is certified that error appears in the above-identified patent and that said Letters Patent is hereby corrected as shown below:

Please delete the following:

Column 6, lines 25-36,
"forming a light shielding layer on a substrate;
patterning the light shielding layer to form at least pair of substantially parallel elements, wherein the one pair of substantially parallel elements has a first gap of a first spacing between the two elements thereof;
forming a phase shift film on the substrate and patterned light shielding layer; and
patterning the phase shift film, wherein portions of the phase shift film are removed, wherein the remaining portions of the phase shift film extend over the first gap and also extend over each of the two elements of the one pair of substantially parallel elements."

Signed and Sealed this

Second Day of June, 1998

Attest:

BRUCE LEHMAN

*Attesting Officer*  *Commissioner of Patents and Trademarks*